(12) United States Patent
Furushima

(10) Patent No.: US 6,219,366 B1
(45) Date of Patent: Apr. 17, 2001

(54) SEMICONDUCTOR OPTICAL DEVICE AND METHOD OF MANUFACTURING THE SAME

(75) Inventor: Yuji Furushima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/071,159

(22) Filed: May 4, 1998

(30) Foreign Application Priority Data

May 2, 1997 (JP) .................................................. 9-114559

(51) Int. Cl.[7] .................................................. H01S 5/10
(52) U.S. Cl. ................................ 372/50; 372/45; 372/46
(58) Field of Search .................. 372/45, 46, 50

(56) References Cited

U.S. PATENT DOCUMENTS

| | | | |
|---|---|---|---|
| 5,541,945 | 7/1996 | Yamaguchi et al. | 372/20 |
| 5,789,274 | 8/1998 | Yamaguchi et al. | 438/32 |
| 5,790,580 | 8/1998 | Sakata et al. | 372/50 |
| 5,953,357 | * 9/1999 | Hirata et al. | 372/45 |
| 5,985,685 | * 11/1999 | Lealman et al. | 372/45 |
| 6,018,539 | * 1/2000 | Kimura et al. | 372/45 |
| 6,034,983 | * 3/2000 | Fujii et al. | 372/45 |

FOREIGN PATENT DOCUMENTS

| | | |
|---|---|---|
| 7-202334 | 8/1995 | (JP) . |
| 7-283490 | 10/1995 | (JP) . |
| 8-70159 | 3/1996 | (JP) . |
| 8-116135 | 5/1996 | (JP) . |
| 8-139417 | 5/1996 | (JP) . |
| 9-23036 | 1/1997 | (JP) . |

OTHER PUBLICATIONS

Kitamura et al., "Low power consumption semiconductor optical amplifier gate with optical spot size converter," 1997 Electronics, Information and Communication Society, C–4–50, p. 422. (No month).

Fukano, H. et al., "1.3μm large spot–size laser diodes with laterally tapered active layer," *Electronics Letters*, vol. 31, No. 17, pp. 1439–1440 (Aug. 17, 1995).

* cited by examiner

*Primary Examiner*—James W. Davie
(74) *Attorney, Agent, or Firm*—Foley & Lardner

(57) ABSTRACT

A semiconductor optical device has a gain region for oscillating a laser light beam and a spot-size conversion region for converting a spot-size of the laser light beam emitted from the gain region. Further, an optical waveguide is formed by the use of a selective growth mask along the gain region and the spot-size conversion region. With such a structure, the optical waveguide includes a waveguide taper portion and has a width and a facet. In this event, the width gradually becomes narrower towards the facet. As a result, the waveguide taper portion is tapered along a direction from the gain region towards the facet.

17 Claims, 13 Drawing Sheets

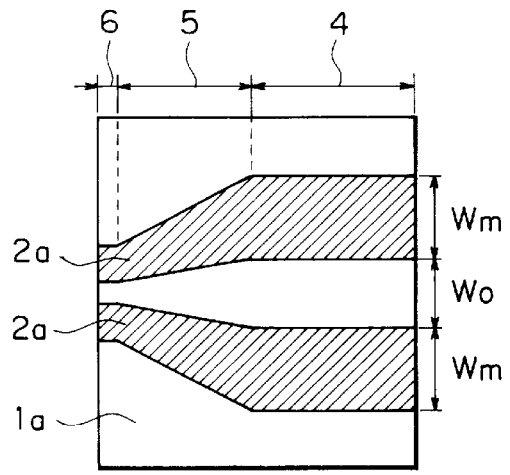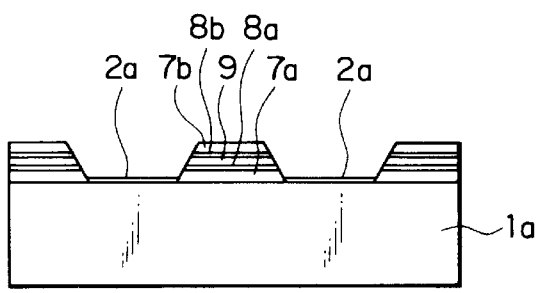
FIG. 6A  FIG. 6B
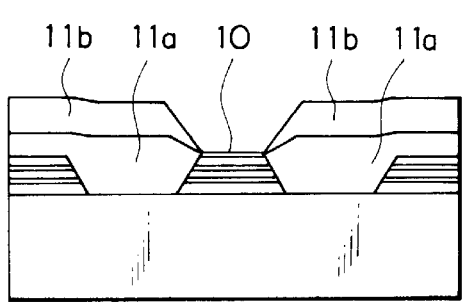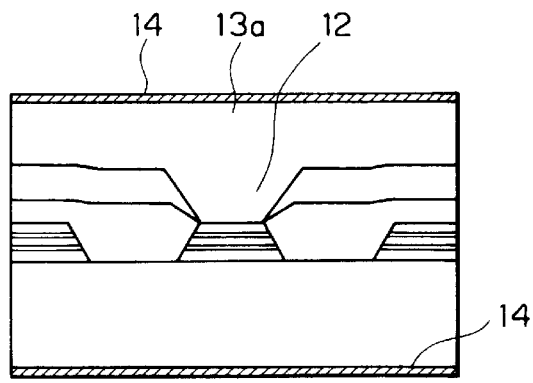
FIG. 6C  FIG. 6D

PARALLEL FULL WIDTH AT
DIRECTION HALF MAXIMUM 13.2°

VERTICAL FULL WIDTH AT
DIRECTION HALF MAXIMUM 15.4°

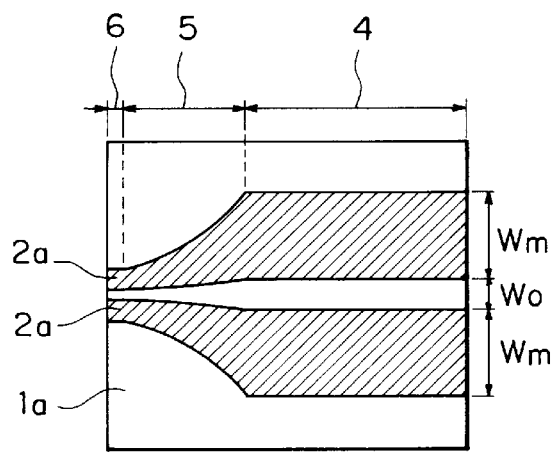
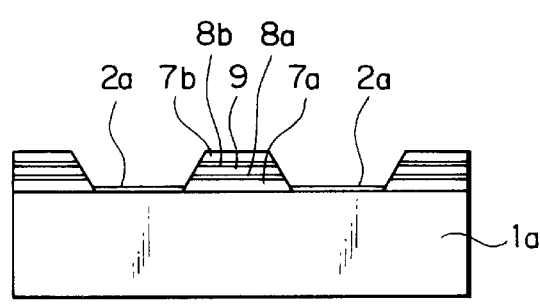
FIG. 10A          FIG. 10B
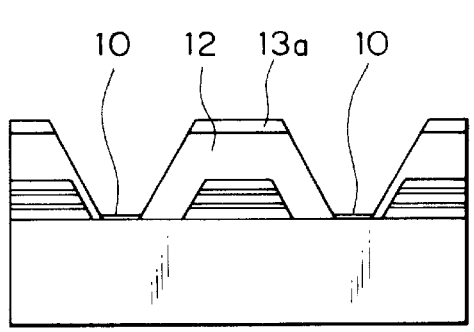
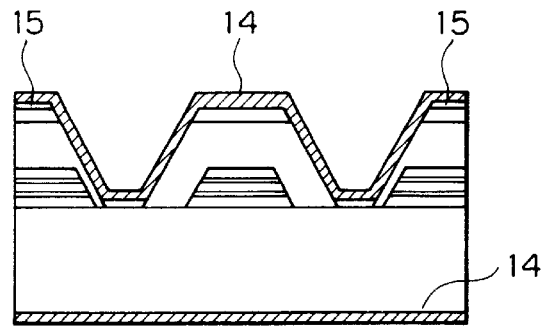
FIG. 10C          FIG. 10D

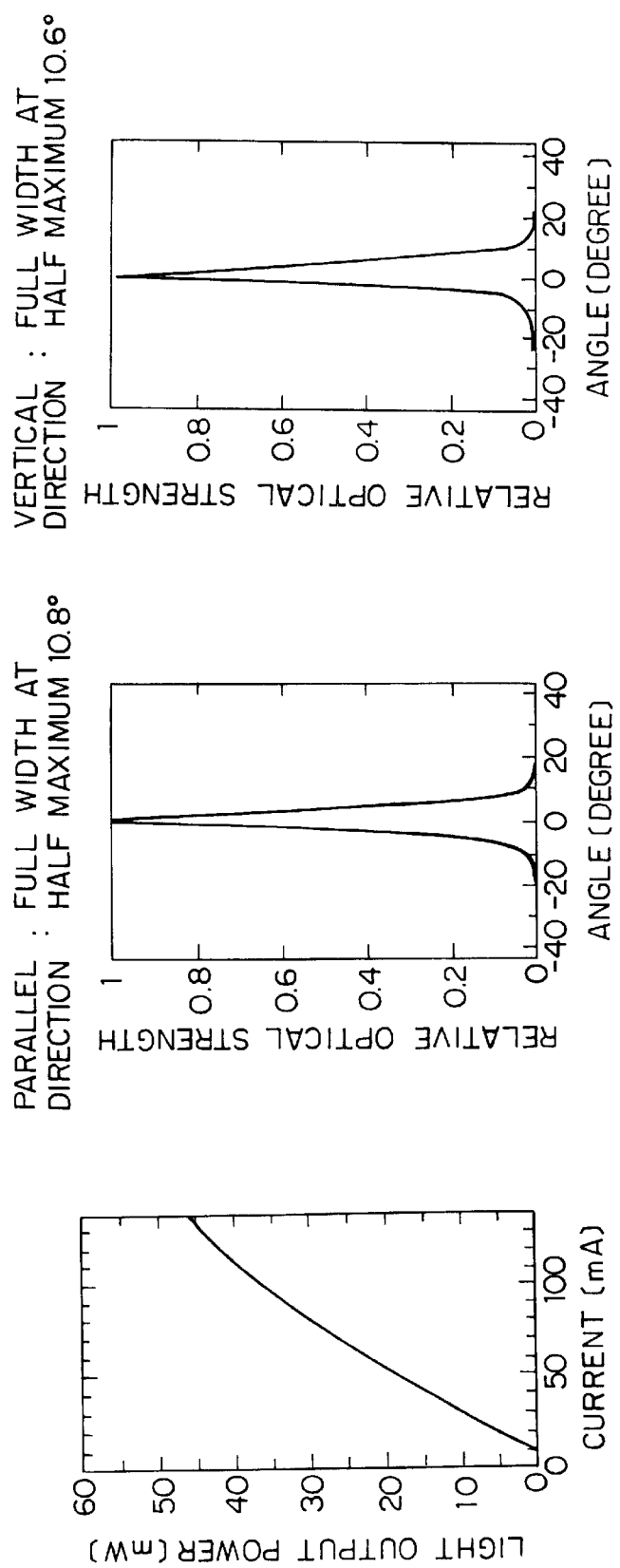

SEMICONDUCTOR OPTICAL DEVICE AND METHOD OF MANUFACTURING THE SAME

BACKGROUND OF THE INVENTION

This invention relates to a semiconductor optical device which are applicable for an optical communication, an optical disk device and an optical interconnection and the like and a manufacturing method thereof, and in particular, to the semiconductor optical device which has a spot-size conversion function and a manufacturing method thereof.

In a semiconductor optical device, such as, a semiconductor laser, a semiconductor optical amplifier and a semiconductor optical modulator, a spot diameter of an optical beam which is emitted from an optical waveguide is small and further, a beam divergence is large. Consequently, it is generally difficult to couple the semiconductor optical device to an optical fiber or a silica-based optical waveguide.

To this end, the semiconductor optical device is conventionally coupled to the optical fiber or the optical waveguide by the use of an optical module with a lens. However, the lens if generally expensive, and further, the position of semiconductor optical device must be adjusted with parts, such as the lens, the optical fiber and the optical waveguide at a high accuracy. This remarkably increases the price of the optical module.

In this event, if the optical spot-size is enlarged at a facet of the semiconductor optical device and further, the beam divergence becomes narrow, the semiconductor optical semiconductor device can be coupled to the optical fiber at the high efficiency without the positional adjustment due to the high accuracy by the use of the expensive lens. Consequently, it may be possible to largely reduce the price of the optical module.

From the above-mentioned reasons, various suggestions has been conventionally made about the semiconductor optical device having the spot-size conversion function.

For instance, suggestion has been made about a semiconductor optical device of the Fabry-perot laser (thereinafter, referred to as FP-LD, and called a first conventional reference) in Japanese Unexamined Publication No. Hei. 7-283490. In this FP-LD, the waveguide of the semiconductor is integrated to convert the optical spot-size. The FP-LD has a gain region and a spot-size conversion region on a semiconductor substrate. With such a structure, the spot-size is enlarged by changing the layer thickness of the optical waveguide to realize a narrow beam divergence in the above spot-size conversion region.

On the other hand, another suggestion has been made about another FP-LD (thereinafter, called a second conventional reference) in Electronics Letters August 1996, Vol. 31 No. 17, pp. 1439–1440. In FP-LD of the second conventional reference, the optical spot-size is enlarged at the laser output facet by the use of a lateral direction taper shape. In this event, the lateral direction taper shape is formed by etching an epitaxial layer which is flatly grown on the entire surface of the substrate without using the selective growth method.

In the first conventional reference, the spot-size conversion region (namely, an active region) must be formed within the length between 200 μm and 300 μm. Consequently, the device yield for each wafer is reduced. Further, the photo-lithography steps must be twice carried out to form the selective growth mask, and the mesa-etching process must be also performed to form the waveguide. As a result, the manufacturing process inevitably becomes complicated.

On the other hand, the above-mentioned problem may be solved because the lateral taper shape having the optical gain is formed by etching the semiconductor active layer in the second conventional reference. However, the semiconductor layer must be processed in a sub-micron order at the tip portion of the tapered waveguide. Consequently, it is difficult to form the waveguide at the high accuracy by the use of the dry method in addition to the wet method. As a result, it is also difficult to uniformly fabricate the taper shape and to excellently reproduce the device characteristic.

Moreover, the device characteristic including the beam divergence largely depends upon the stripe width of the active layer in the first conventional reference. Consequently, it is difficult to stably fabricate the device having the narrow beam divergence on the condition that the excellent characteristic, the reproducibility and the uniformity of the shape are kept.

Further, the process accuracy is slightly increased in the dry method as compared to the patterning due to the wet method to form the optical waveguide. However, the active layer is damaged from the side surface in this case. Moreover, it is difficult to excellently form a buried layer at the side surface of the optical waveguide layer during growing the buried layer which is carried out after patterning the optical waveguide layer. Consequently, it is also difficult fabricate the device at a high reliability.

To avoid this problem, the wet process must be carried out to remove the damaged layer after the dry-etching process. Finally, the high process accuracy can be practically obtained.

Further, when the coupling with the optical fiber is taken into account, it is desirable that the optical spot is formed into an approximately circular shape at the output facet with the small emission angle. However, the circular spot shape is realized only by changing the layer thickness like the first conventional reference or by forming the lateral taper shape like the second conventional reference. Consequently, the design flexibility of the device parameters, such as, the active layer structure, the active layer width and the taper shape, is remarkably restricted.

SUMMARY OF THE INVENTION

It is therefore an object of this invention to provide a semiconductor optical device which has a spot-size conversion function and which is capable of emitting an optical beam having an approximately circular spot shape with a narrow beam divergence.

It is another object of this invention to provide a method which is capable of manufacturing a semiconductor optical device having a spot-size conversion function with excellent reproducibility and uniformity of a taper shape and a device characteristic.

According to this invention, a semiconductor optical device has a gain region for oscillating a laser light beam and a spot-size conversion region for converting a spot-size of the laser light beam emitted from the gain region. Further, an optical waveguide is formed by the use of a selective growth mask along the gain region and the spot-size conversion region.

With such a structure, the optical waveguide includes a waveguide taper portion and has a width and a facet. In this event, the width gradually becomes narrower towards the facet. As a result, the waveguide taper portion is tapered along a direction from the gain region towards the facet.

More specifically, both the mask width and the opening width of the selective growth mask are formed in the taper form. Further, the optical waveguide is directly formed only by the use of the selective growth without the etching process. If the optical waveguide is formed by the use of the etching process, the epitaxial growth layer having the layer thickness of between about 0.6 µm and 1.5 µm must be etched. It is difficult to process the semiconductor layer having the above layer thickness in the sub-micron order with the accuracy and the excellent reproducibility.

On the other hand, when the optical waveguide is formed by the use of the selective growth, the accuracy, the reproducibility and the uniformity of the optical waveguide depends upon the accuracy, the reproducibility and the uniformity of the selective growth mask.

consequently, the semiconductor layer can be processed in the sub-micron order at the high accuracy and the reproducibility. This is also because the selective growth mask is formed by a dielectric thin layer having the layer thickness between 0.05 µm and 0.1 µm, such as, a $SiO_2$ film and a $Si_3N_4$ film, and further, the etching depth becomes about 1/10 as compared to the case of the etching process of the epitaxial layer. Namely, the dimension accuracy and the dimension variation can be also set to about 1/10 as compared to the conventional case.

Moreover, the stripe width of the optical waveguide which is formed by the selective growth becomes narrower than the opening width of the selective growth mask. Consequently, the stripe can be formed with the dimension which is less than the resolution limit determined in the photo-lithography, for example, the dimension which is less than the quarter micron, with the high accuracy and the excellent reproducibility.

Further, the mask width itself in addition to the mask opening width gradually becomes narrower towards the facet direction in the selective growth mask which determines the lateral width dimension of the semiconductor waveguide. By adopting this method, the design flexibility is remarkably enhanced. Further, the optical spot-size can be efficiently enlarged in accordance with the waveguide length of the short spot-size converter. Moreover, the design can be easily carried out to obtain the circular optical spot shape.

BRIEF DESCRIPTION OF THE DRAWINGS

FIG. 6A is a plan view for explaining a step of manufacturing a semiconductor optical device according to a first example corresponding to the first embodiment illustrated in FIG. 3;

FIGS. 6B through 6D are cross sectional views for explaining steps of manufacturing a semiconductor optical device according to a first example;

FIG. 10A is a plan view for explaining a step of manufacturing a semiconductor optical device according to a second example corresponding to the first embodiment illustrated in FIG. 3;

FIGS. 10B through 10D are cross sectional views for explaining steps of manufacturing a semiconductor optical device according to a second example;

FIGS. 12A through 12C show a L-I characteristic and an optical strength distribution of a far-field patter of a semiconductor laser having a narrow beam divergence according to a second example;

DESCRIPTION OF THE PREFERRED EMBODIMENTS

Figure 1A:
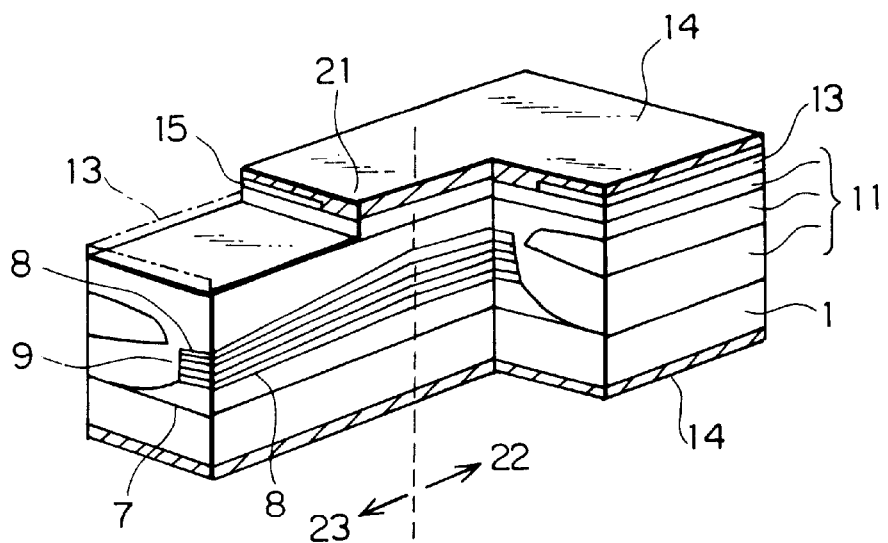
FIG. 1A is a cross sectional perspective view showing a semiconductor optical device according to a first conventional reference.
Figure 1B:
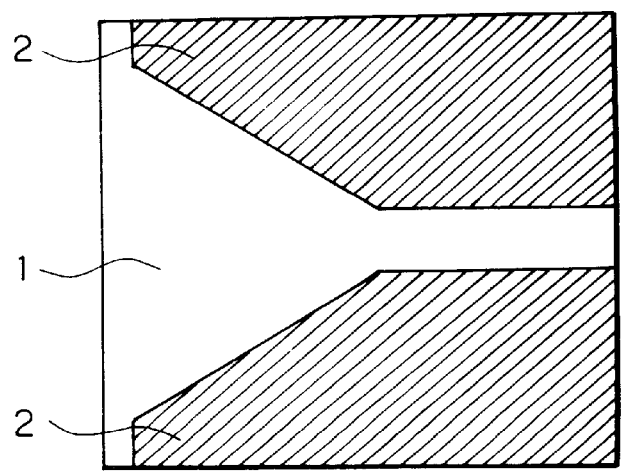
FIG. 1B is a plan view for explaining a method of manufacturing a semiconductor optical device according to a first conventional reference.
Figure 2:
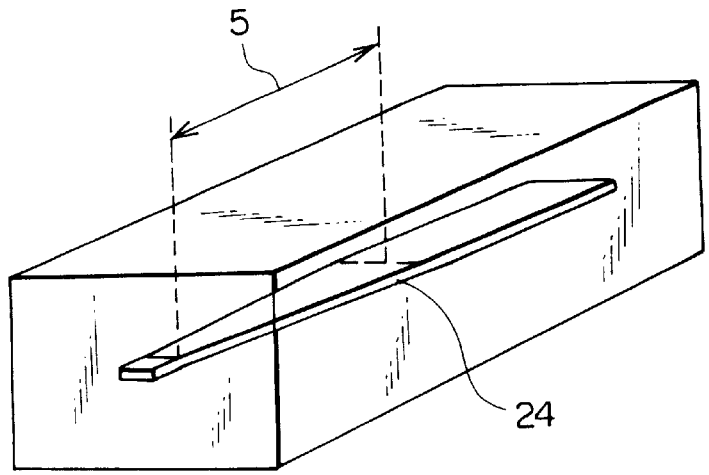
FIG. 2 is a perspective view showing a semiconductor optical device according to a second conventional reference.

Referring to FIGS. 1 and 2, conventional semiconductor optical devices will be first described for a better understanding of this invention. The semiconductor optical devices are equivalent to the conventional semiconductor optical devices mentioned in the preamble of the instant specification.

The FP-LD of the first conventional reference (disclosed in Japanese Unexamined Publication No. Hei. 7-283490) will be manufactured as follows.

In this FP-LD, the optical waveguide of the semiconductor is integrated to convert the optical spot-size. The FP-LD has a gain region 22 and a spot-size conversion region 23 on a semiconductor substrate 1, as illustrated in FIG. 1A.

As shown in FIG. 1B, a selective growth mask 2 is formed on the semiconductor substrate 1 so that a constant opening width is kept in the gain region 22 while the opening width is gradually widen towards one facet in the spot-size conversion region 23.

Further, a clad layer 7, a separate confinement heterostructure (thereinafter, abbreviated a SCH) layer 8, a multi-quantum well (thereinafter, abbreviated a MQW) layer 9, a SCH layer 8 and clad layer are successively deposited on the semiconductor substrate 1, as illustrated in FIG. 1A. In this event, an epitaxial layer is formed such that the layer thickness is gradually reduced towards the facet of the spot-size conversion region 23.

Subsequently, a stripe-shaped mask having the width of 1.5 μm is formed on the epitaxial layer which is selectively grown. Thereby, the epitaxial layer is patterned, and a current blocking layer 11 is selectively grown on the condition that the stripe shaped mask is left.

Successively, a contact layer 13 is formed thereon. Further, an insulating layer 15 having an opening 21 only on the gain region 22 is formed thereon. Thereafter, electrodes 14 are formed on upper and lower surfaces of the substrate 1.

With such a structure, the spot-size is enlarged by changing the layer thickness of the optical waveguide to realize a narrow beam divergence in the spot-size conversion region 23 in the first conventional reference.

On the other hand, the FP-LD of the second conventional reference (disclosed in Electronics Letters August 1996, Vol. 31 No. 17, pp. 1439–1440) will be manufactured as follows by using the manufacturing technique of the conventional buried hetero (thereinafter, abbreviated as BH) structure LD, referring to FIG. 2.

An MQW layer is formed by the use of the epitaxial growth on a semiconductor substrate. In this event, the MQW layer is interposed between SCH layers. The epitaxial layer is patterned by the use of the photo-lithography method and the etching method to form a semiconductor active layer 24, as illustrated in FIG. 2. Herein, the semiconductor active layer 24 is formed into a mesa shape and has a taper portion 5 and a rear straight portion. Thereafter, a current blocking layer (not shown) is grown around the mesa stripe. Further, an over clad layer and a contact layer (not shown) are successively grown. Thus, the LD illustrated in FIG. 2 having a large spot-size is completed.

With such a structure, the optical spot-size is enlarged at the laser output facet by the use of the lateral direction taper shape in the second conventional reference. In this event, the lateral direction taper shape is formed by etching the epitaxial layer which is flatly grown on an entire surface of the substrate without using the selective growth method.

If the coupling with the optical fiber is taken into account, it is desirable that the optical spot is formed approximately circular shape at the output end with the small emission angle. However, the approximate circular spot is realized only by changing the layer thickness like the first conventional reference or by forming the lateral taper shape like the second conventional reference. Consequently, the design flexibility of the device parameters, such as, the active layer structure, the active layer width and the taper shape, is remarkably restricted.

Taking the above-mentioned problem into consideration, this invention provides a semiconductor optical device which has a spot-size conversion function and which is capable of emitting a optical beam having an approximately circular spot-shape with a narrow beam divergence.

(First embodiment)

Figure 3:
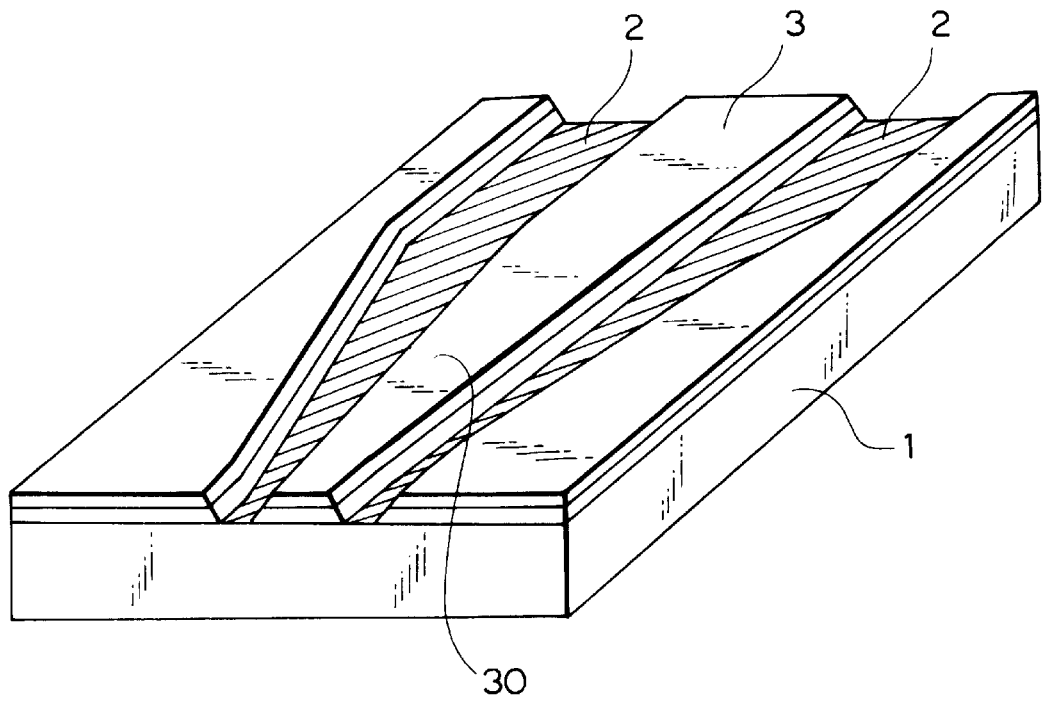
FIG. 3 is a perspective view showing a semiconductor optical device according to a first embodiment.

Referring to FIG. 3, description will be made about a semiconductor optical device according to a first embodiment of this invention.

As illustrated in FIG. 3, a selective growth mask 2 having a taper shaped portion is formed so that both a mask opening width and a mask width are gradually reduced towards a forward facet of a semiconductor laser. A semiconductor layer which constitutes an optical waveguide is formed by the use of the epitaxial growth with the above mask. Thereby, a mesa-type semiconductor optical waveguide 3 is directly formed on a semiconductor substrate 1. In this event, the mesa-type semiconductor optical waveguide 3 has a portion 30 which is formed in a taper shape in a lateral direction or in vertical and lateral directions as a spot-size conversion region.

Namely, the optical waveguide having the spot-size conversion function is formed in a lateral taper shape which has an uniform layer thickness and a band gap wavelength in an optical waveguide direction in the semiconductor optical device according to this invention. In this case, the taper portion 30 can be used as an active waveguide.

On the other hand, the optical waveguide may be formed in a vertical and lateral taper shape in which the waveguide width becomes narrower and the layer thickness also becomes smaller to shorten a band gap wavelength towards the facet. In this event, the taper portion 30 can be used as a passive waveguide.

Herein, a multi-semiconductor layer of the optical waveguide is selectively and effectively grown by the use of the metal organic vapor phase epitaxy (thereinafter, abbreviated as a MOVPE). Alternatively, the molecular beam epitaxy (thereinafter, abbreviated as a MBE) may be used. In this case, the optical waveguide is formed by a quantum well structure or a multi-quantum well structure as a core layer.

More specifically, the quantum well structure is formed by arranging a quantum well structure, a multi-quantum well structure or an optical confined layer at an upper or a lower sides and both sides. This formation is similar to a second and third embodiments which will be later described.

Although the above opening width of the selective grown mask 2 can be optionally designed, it is desirable that the opening width is set in the range between 0 μm and 1 μm at a forward facet of the semiconductor laser and in the range between 1 μm and 3 μm at a rear facet thereof.

The changing quantity of the mask width is set to a proper value between several μm and several tens μm for the change of the mask opening width of about several μm. Thereby, the layer thickness and the band gap wavelength of the semiconductor active layer are kept constant in the resonator direction. Consequently, the lateral taper semiconductor laser having the narrow beam divergence can be fabricated. In this event, the active layer having the optical gain serves as the spot-size conversion waveguide.

On the other hand, the changing quantity of the mask width may be designed larger than the above value, for example, to several tens μm. Thereby, the semiconductor laser active layer having the optical gain can be entirely grown to integrate with the spot-size conversion passive waveguide of the lateral and vertical taper type. In this event, the optical waveguide width, the layer thickness and the bank gap wavelength become smaller towards the forward facet of the semiconductor laser.

In the first embodiment, the optical waveguide layer may be grown by the use of the selective growth mask having no mask opening at the output side facet like the subsequent second embodiment. Thereby, a window structure may be formed at the optical output facet portion without the etching process.

(Second embodiment)

Figure 4A:
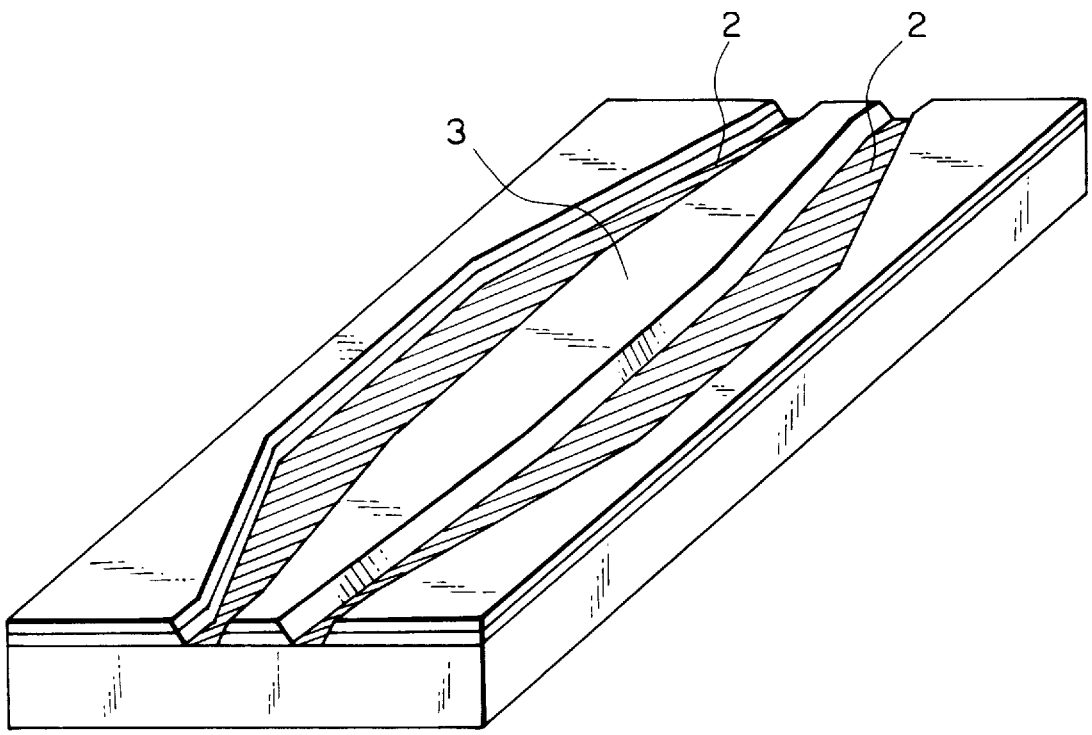
FIG. 4A is a perspective view showing a semiconductor optical device according to a second embodiment.
Figure 4B:
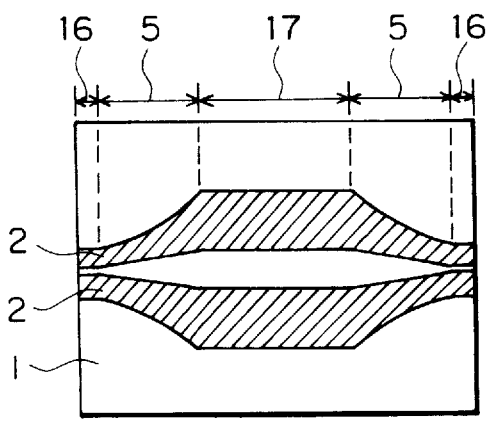
FIG. 4B is a plan view showing a semiconductor optical device according to a second embodiment.
Figure 4C:
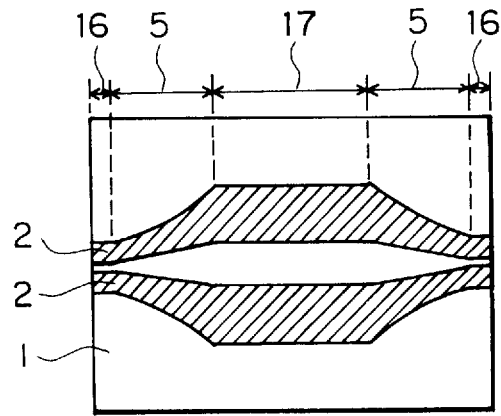
FIG. 4C is another plan view showing a semiconductor optical device according to a second embodiment.

Referring to FIGS. 4A through 4C, description will be made about a semiconductor optical device according to a second embodiment of this invention.

Both facets must be coupled to an optical fiber or a quarts-based optical waveguide in a semiconductor optical amplifier. In this event, an optical light beam is entered to one facet while the optical light beam which is amplified in an active layer is emitted from another facet.

Consequently, the optical spot-sizes must be enlarged at the both facets to produce an optical module with a low price.

As shown in FIG. 4B, the mask width and the mask opening width are kept constant in a linear gain waveguide portion 17 and a facet straight portion 16 on a substrate 1. On the other hand, a selective growth mask 2 is formed on the semiconductor substrate 1 so that both the mask width and the mask opening width become narrower towards the facet in a taper portion 5. Further, the semiconductor layer is formed by the use of the epitaxial growth by using the selective growth mask 2 as a mask. Thereby, a mesa-type semiconductor optical waveguide 2 which has the optical spot-size conversion (enlarging) function at the both facets is obtained. Specifically, taper shapes are formed in a lateral direction or vertical and lateral directions at the both surface sides in the above mesa-type semiconductor optical waveguide 3.

The spot-size conversion region which is placed in the taper portion 5 is formed as the optical waveguide which has the taper in only the lateral direction or the lateral and vertical directions. More specifically, the spot-size conversion region is formed in the lateral taper type which has the approximately uniform layer thickness and the band gap wavelength composition. Alternatively, the spot-size conversion region may be formed in the vertical and lateral taper type in which the layer thickness becomes thinner and the band gap wavelength becomes shorter as the wavelength width becomes narrower towards the facet. In this event, the former can be used an active waveguide while the latter can be used as a passive waveguide.

Alternatively, the optical waveguide having a window structure may be formed by using a selection mask which has no opening in a window structure portion 18, as illustrated in FIG. 4C. In this event, after the mesa-type semiconductor optical waveguide 3 is formed by the use of the epitaxial growth process, the selective growth mask 2 is removed. Thereafter, another selective growth mask (not shown) is formed on the optical waveguide 3, and a buried layer is formed to cover a side surface and both facets of the optical waveguide layer.

Subsequently, the optical waveguide 2 having the window structure portion 18 is formed by cleaving the embedding layer in the forward direction of the waveguide facet.

Moreover, an electrical field absorb type modulator may be formed instead of the optical amplifier in the second embodiment.

(Third embodiment)

Figure 5A:
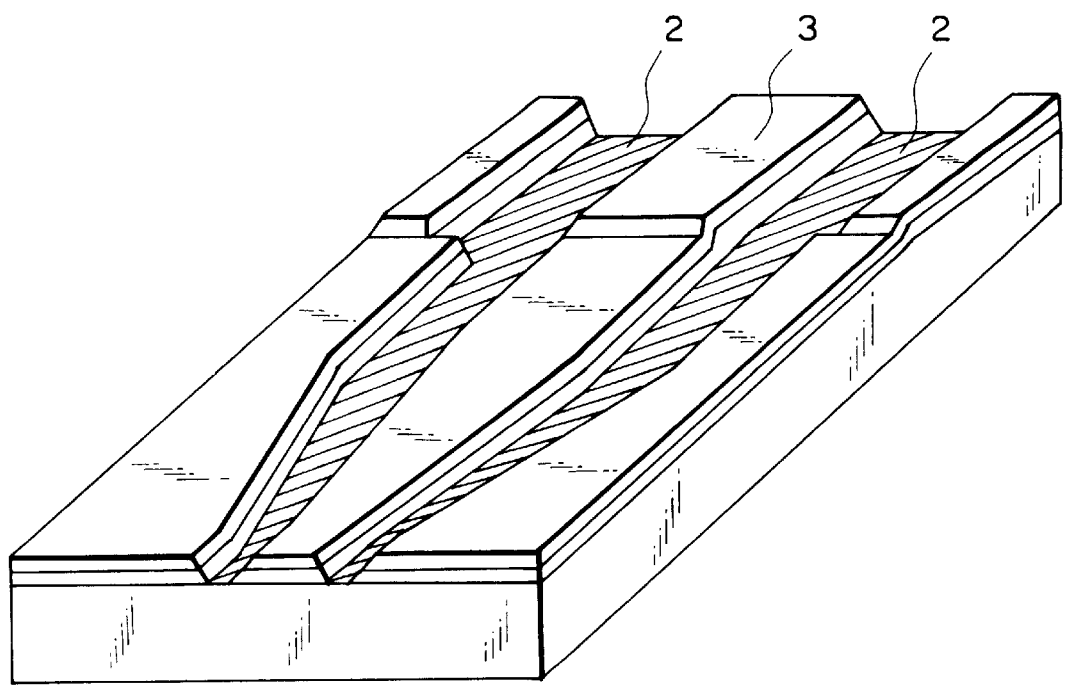
FIG. 5A is a perspective view showing a semiconductor optical device according to a third embodiment.
Figure 5B:
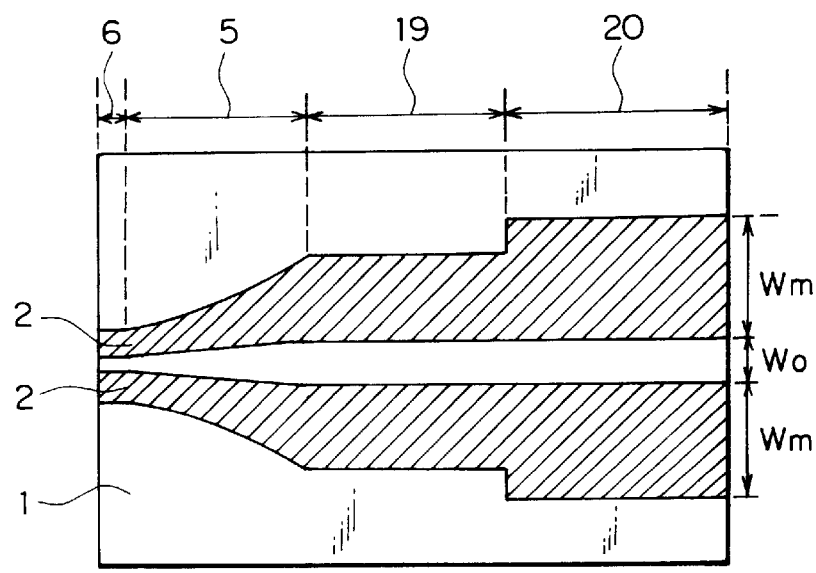
FIG. 5B is a plan view showing a semiconductor optical device according to a third embodiment.

Referring to FIGS. 5A and 5B, description will be made about a semiconductor optical device according to a third embodiment of this invention.

An optical modulator integration type semiconductor laser is efficiently coupled to an optical fiber according to this invention. In this event, an optical output from a laser portion can be reduced. Herein, the laser portion must emit a laser light beam of a desired strength to the optical fiber. As a result, a carrier pileup is suppressed at a modulator portion to reduce the drop of an extinction ratio caused by the carrier pileup.

As shown in FIG. 5B, a selective growth mask 2 is formed on a substrate 1. In this event, the mask opening width Wo of the selective growth mask 2 is kept constant in a distributed feedback (thereinafter, abbreviated as a DFB) laser portion 20 and an electrical absorb type modulator portion 19, as illustrated in FIG. 5B.

Further, the mask opening width Wo gradually becomes narrower towards an optical output facet in a taper portion 5. Moreover, the mask opening width Wo is kept constant at a forward straight portion 6.

On the other hand, the mask width Wm is widely formed in the DFB laser portion 20 while the mask width Wm is narrowly formed in the electrical absorb type modulator portion 19. Thus, there is a step difference between the DFB laser portion 20 and the electrical absorb type modulator portion 19. Further, the mask width Wm gradually becomes narrower towards the optical output facet in the taper portion 5 while the mask width Wm is kept constant in the forward straight portion 6.

The semiconductor layer constituting the optical waveguide 3 is formed by the use of the epitaxial growth method on the substrate 1 by using the selective growth mask 2 as a mask. In this event, the layer thickness of the modulator portion 19 is thinner than that of the DFB laser portion 20 to shorten the band gap wavelength, as shown in FIG. 5A.

Further, the lateral taper type which has the approximately uniform layer thickness and the band gap wavelength composition towards the optical waveguide direction is formed in the taper portion 5. Herein, the optical waveguide has the spot-size conversion function in the taper portion 5.

Alternatively, the vertical and lateral taper type may be formed in the taper portion 5. Herein, the waveguide width gradually becomes narrower towards the facet and the layer thickness becomes thinner to shorten the band gap wavelength in the taper portion 5.

In this embodiment, the optical waveguide layer may formed by using the selective growth mask having no mask opening at the output facet. Thereby, the window structure may be formed at the optical output facet portion without the etching process like in the second embodiment.

First Example

Referring to FIGS. 6A through 6D, description will be made about a semiconductor optical device according to a first example of this invention. Herein, the first example corresponds to the first embodiment illustrated in FIG. 3.

As shown in FIG. 6A, a $SiO_2$ film having the layer thickness of 0.1 $\mu$m is deposited by the use of the CVD method on an n-InP substrate 1a and is patterned by the use of the photo-lithography method and the dry-etching method to form a $SiO_2$ mask 2a. The mask width Wm and the opening width Wo of the mask 2a are set to 10.0 $\mu$m and 2.0 $\mu$m in the rear straight portion 4 having a length of 75 $\mu$m, respectively. Further, the mask width Wm and the opening width Wo gradually become smaller, and are set to 5.0 $\mu$m and 0.7 $\mu$m in the forward straight portion 6 having the length of 25 $\mu$m, respectively.

In this case, the positioning accuracy of the laser facet which is normally cleaved is equal to about several $\mu$m at best in the forward straight portion 6. To this end, this forward straight portion 6 is arranged to prevent an error for the active layer width. In this event, this error occurs in the forward output end in accordance with the cleavage positioning accuracy.

The error from the design value of the mask opening width Wo is equal to 0.025 μm when the taper design of the opening portion is the same with this invention and the facet position is deviated at 5 μm without the forward straight portion. Although the above positioning accuracy is slightly larger than the optical width accuracy of this example which is determined by the patterning accuracy of the selective growth mask 2a, the forward straight portion 6 can be formed with a sufficiently high accuracy as compared to the conventional case in which the optical waveguide width is determined by the etching quantity for the semiconductor layer.

The length of the forward straight portion 6 is not limited to 25 μm in this example, and may be set to 0 μm. Namely, the design can be optionally carried out to include the case having no forward straight portion. Further, the presence or absence of the straight portion 6 and 4 at the forward facet, the backward facet and the both surfaces can also be optionally selected.

On the substrate 1a having such a SiO$_2$ mask 2a, an n-InP clad layer 7a (the thickness of 0.2 μm, the doping concentration of 1×10$^{18}$ cm$^{-3}$), an n-type InGaAsP-SCH layer 8a (a PL (photo-luminescence) wavelength of 1.05 μm composition, the thickness of 50 nm+the PL wavelength of 1.13 μm composition, the thickness of 10 nm), an InGaAs quantum well structure layer (the thickness of 5 nm) with +0.7% compressive strain, a MQW layer 9 (the number of quantum well of six, the PL wavelength of about 1.3 μm) consisting of an InGaAs P barrier layer (the PL wavelength of 1.13 μm composition, the thickness of 8 nm), a p-type InGa AsP-SCH layer 8b (the PL wavelength of 1.13 μm composition, the thickness of 10 nm+the PL wavelength of 1.05 μm composition, the thickness of 50 nm), and a p-InP clad layer 7b (the thickness of 0.1 μm, the doping concentration of 7×10$^{17}$ cm$^{-3}$) are successively deposited under the composition and the layer thickness design value in the rear straight portion 4 (Wm=10.0 μm, Wo=2.0 μm), as illustrated in FIG. 6B.

Herein, the center of the active layer consisting of the SCH layers 8a, 8b and the MQW layer 9 is positioned at the height of 0.2 μm+{50 nm+10 nm+(5 nm×6+8 nm×5)+10 nm+50 nm}/2=0.295 μm from the InP substrate 1a. The mesa which is formed by the selective growth method is structured so that the slope has an angle of 54.7° for the substrate 1a. Consequently, the width of the active layer at this position becomes narrower at 2×0.295 μm×cost 54.7°= 0.417 μm than the opening width of the SiO$_2$ mask 2a.

Therefore, the design value of the active layer width is equal to 2.0 μm−0.417 μm=1.583 μm at the rear facet and 0.7 μm−0.417 μm=0.283 μm at the forward facet in this example, when it is assumed that the selective growth rate is kept constant independently of the position of the resonator.

Subsequently, after the SiO$_2$ mask 2a is removed, another SiO$_2$ mask 10 is formed only on the mesa type optical waveguide including the active layer by the use of the CVD method and the photo-lithography, as illustrated in FIG. 6C. Successively, a current squeeze structure which is composed of a p-InP blocking layer 11a (the thickness of 0.5 μm, the doping concentration of 3×10$^{17}$ cm$^{-3}$) and an n-InP blocking layer 11b (the thickness of 0.7 μm, the doping concentration of 1×10$^{18}$ cm$^{-3}$) is deposited on the substrate 1a, as shown in FIG. 6C.

Next, a p-InP buried layer 12 and a p-InGaAS contact layer 13i aare successively deposited after the SiO$_2$ mask 10 is removed, as shown in FIG. 6D. Thereafter, electrodes 14 are formed at upper and lower surfaces of the substrate 1a. Thus, the semiconductor laser having the narrow beam divergence is completed, as illustrated in FIG. 6D.

Figure 7A:
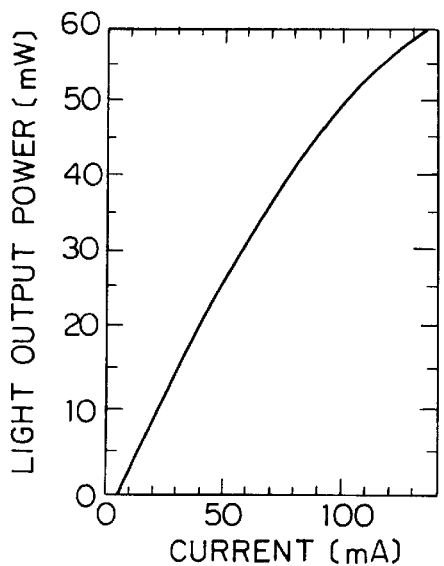
FIGS. 7A through 7C show a L-I (light output power-injection current) characteristic and an optical strength distribution of a far-field pattern of a semiconductor laser having a narrow beam divergence according to a first example.
Figure 7B:
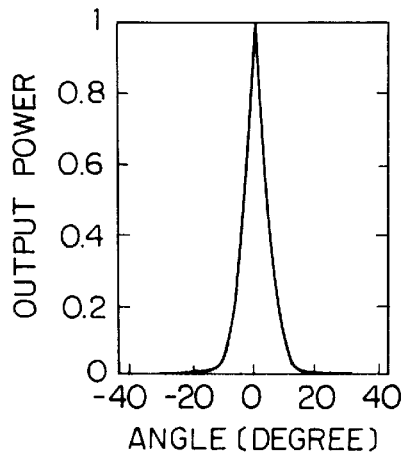
Figure 7C:
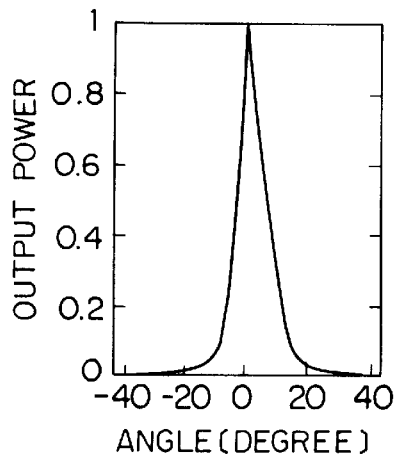

In FIGS. 7A through 7C, a L-I characteristic and a beam divergence characteristic of the semiconductor optical device are exemplified. Herein, the semiconductor optical device is coated with a multi-film which has a reflection rate of 95% at the rear facet after cleaving a resonator length to 250 μm. In this event, a threshold current is equal to 6.0 mA at 25° C., a slope efficiency is equal to 0.56 W/A, full width at half maximum of the far-field pattern optical strength distribution is equal to 13.2° in the parallel direction and 15.4° in the vertical direction with respect to the narrow beam divergence characteristic.

Further, the width of each of the active layers of thirty devices which are taken out from arbitrary positions within radius 18 mm of three different wafer has an average value of 0.288 μm and a standard deviation of 0.018 μm at the forward facet, and the average value of 1.587 μm and the standard deviation of 0.022 μm at the rear facet, respectively. Thus, the semiconductor optical device is excessively superior in the uniformity and the reproducibility.

Each of three hundred devices which are taken out in the same manner has the standard deviation of 0.52 mA of the threshold current at 25° C., the standard deviation of the slope efficiency of 0.041 W/A, the standard deviation of full width at half maximum of the far-field pattern optical strength distribution of 0.5° in the parallel direction and 0.6° in the vertical direction. Thus, the semiconductor optical device has excessively excellent uniformity and the reproducibility.

Figure 8A:
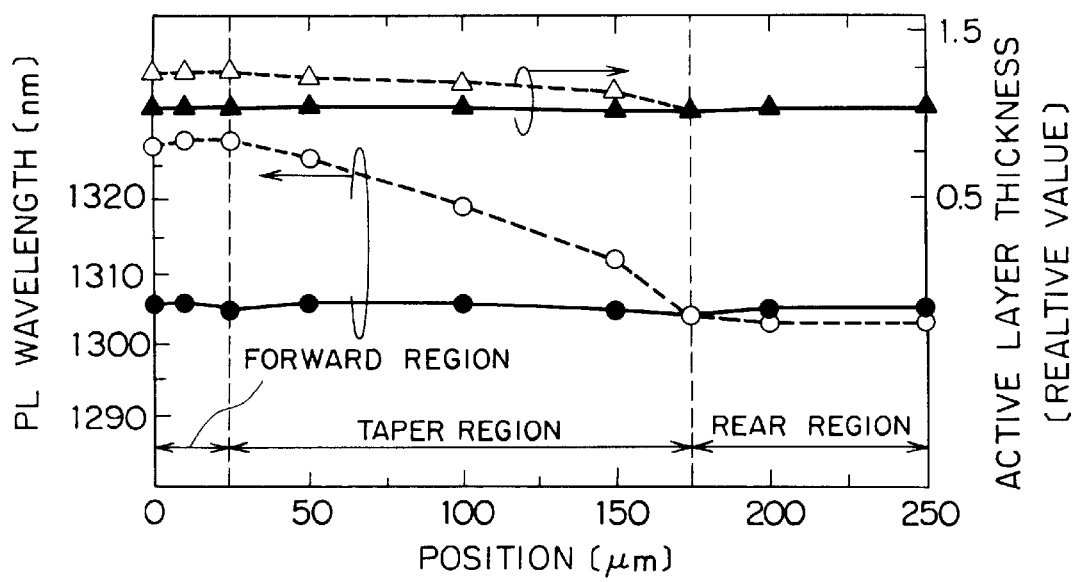
FIG. 8A is a profile showing a layer thickness in a resonator direction and a band gap wavelength (photo-luminescence wavelength) according to a first example.
Figure 8B:
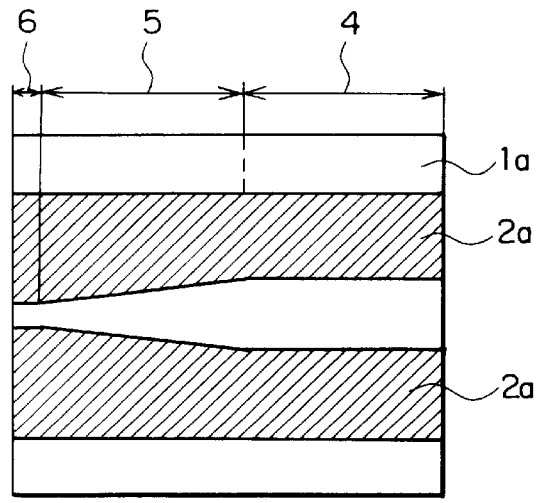
FIG. 8B is a plan view showing a semiconductor optical device according to a first example.

The layer thickness and the band gap wavelength of the active layer consisting of the SCH layers 8a and 8b and the MQW layer 9 according to this example is kept constant in the resonator direction, as indicated by a solid line in FIG. 8A. In contrast, when only the opening portion having the taper shape in FIG. 6A is arranged on the rectangular SiO$_2$ mask 2a as shown in FIG. 8B, the spot-size conversion efficiency is remarkably reduced as indicated by a dot line in FIG. 8A. This is because the thickness of the active layer which is selectively grown is increased as the opening portion becomes narrower. Further, the optical gain wavelength of the entire resonator is dispersed because the band gap wavelength becomes long. Consequently, the L-I characteristic of the semiconductor laser is largely degraded.

The selective growth mask 2a of this example is designed to avoid the deterioration of the performance as the semiconductor laser having the narrow beam divergence. Consequently, the active layer thickness and the band gap wavelength are kept almost constant. However, an optimum value of the mask width Wm which is accompanied with the change of the opening width Wo is variable in accordance with the growth method and the growth condition of the semiconductor optical waveguide including the active layer in addition to the changing quantity of the opening width and the referential mask width. Therefore, the dimension of the selective growth mask 2a is not limited to the above-mentioned value, and should be suitably determined by taking the characteristic of the optical waveguide, the growth method and the growth condition of the semiconductor layer into consideration.

Moreover, it is unnecessary that the layer thickness and the band gap composition become completely uniform in the optical waveguide direction, and it is possible that the band gap composition has a certain degree of distribution.

Figure 9A:
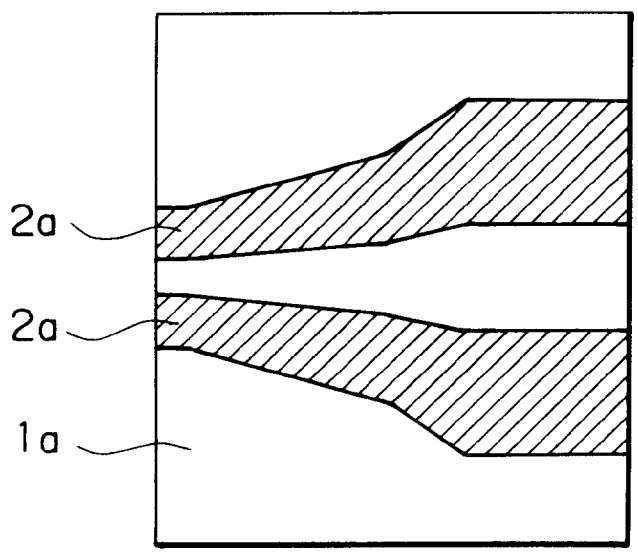
FIG. 9A shows an example of a mask shape for manufacturing a lateral taper type semiconductor layer having a narrow beam divergence according to a first example.
Figure 9B:
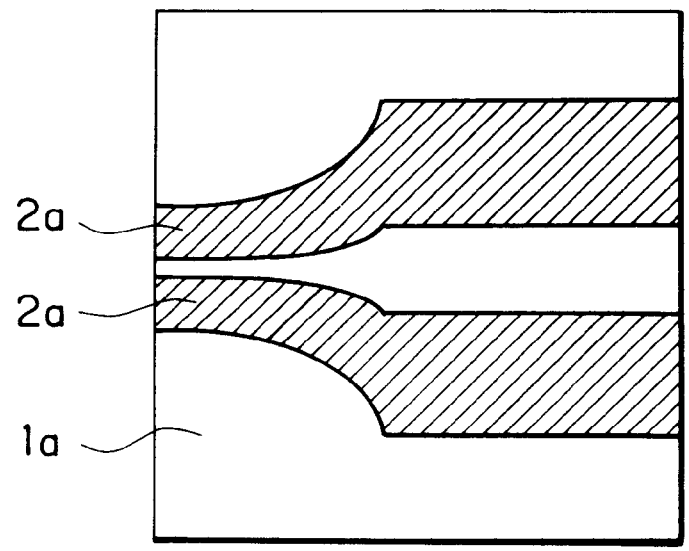
FIG. 9B shows another example of a mask shape for manufacturing a lateral taper type semiconductor laser having a narrow beam divergence according to a first example.

Further, the taper shape is not limited to the linear shape as illustrated in FIG. 6A, and the taper shape may have a gently taper or the different taper length towards the forward facet, as shown in FIGS. 9A and 9B. At any rate, any shapes can be adopted as long as the optical waveguide includes the portion in which the mask width Wm and the opening width Wo gradually becomes smaller towards the facet.

(Second Example)

Referring to FIGS. 10A through 10D, description will be made about a semiconductor optical device according to a second example of this invention. Herein, the second example also corresponds to the first emobdiment illustrated in FIG. 3.

As shown in FIG. 10A, a $SiO_2$ film having the layer thickness of 0.05 μm is deposited by the use of the CVD method on an n-InP substrate 1a and is patterned by the use of the photo-lithography method and the dry-etching method to form a $SiO_2$ mask 2a. The mask width Wm and the opening width Wo of the mask 2a are set to 50.0 μm and 1.6 μm in the rear straight portion 4 having the length of 190 μm, respectively. Further, the mask width Wm and the opening width Wo gradually become smaller in the taper portion 5 having the length of 150 μm, and are set to 6.0 μm and 0.6 μm in the forward straight portion 6 having the length of 10 μm, respectively.

On the substrate 1a having such a $SiO_2$ mask 2a, an n-InP clad layer 7a (the thickness of 0.2 μm, the doping concentration of $1\times10^{18}$ cm$^{-3}$), an n-type InGaAsP-SCH layer 8a (the PL wavelength of 1.13 μm composition, the thickness of 50 nm), a MQW layer 9 (the number of quantum well of even, the PL wavelength of about 1.3 μm) consisting of an InGaAsP quantum well structure layer (the thickness of 5 nm) with +1.0% compressive strain and an InGaAsP barrier layer (the PL wavelength of 1.1 μm composition, the thickness of 8 nm), a p-type InGa AsP-SCH layer 8b (the PL wavelength of 1.13 μm composition, the thickness of 50 nm) and a p-InP clad layer 7b (the thickness of 0.1 μm, the doping concentration of $7\times10^{17}$ cm$^{-3}$) are successively deposited under the composition and the layer thickness design value in the rear straight portion 4 (Wm=10.0 μm, Wo=2.0 μm), as illustrated in FIG. 10B.

Figure 11:
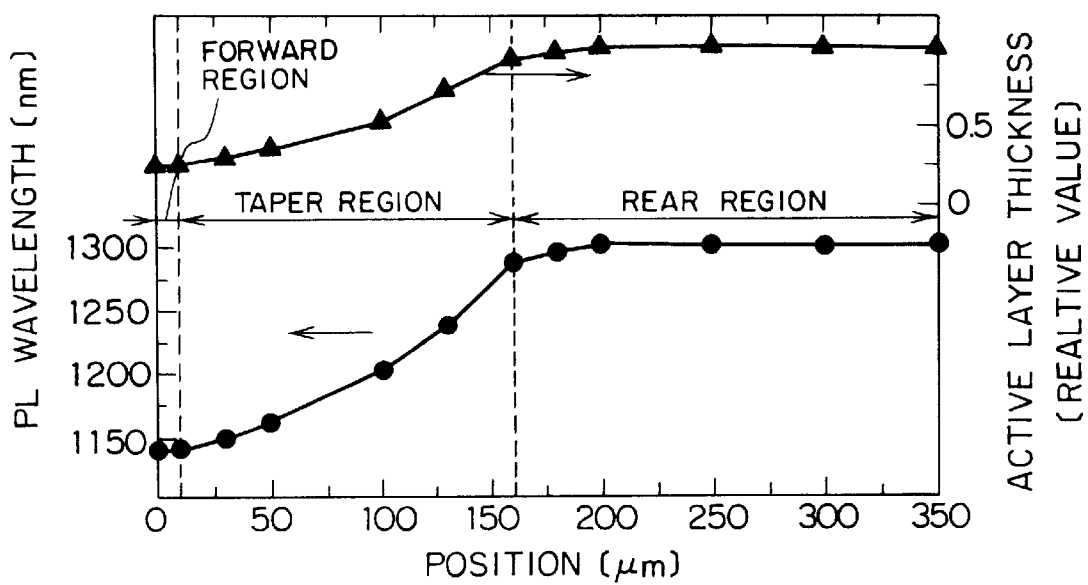
FIG. 11 is a profile showing a layer thickness in a resonator direction and a band gap wavelength (photo-luminescence wavelength) according to a second example.

In this event, the layer thickness and the band gap wavelength of the active layer having the SCH layers 8a, 8b and the MQW layer 9 are illustrated in FIG. 11. As shown in FIG. 11, the layer thickness of the optical waveguide is reduced in the taper portion 5 of the mask 2a and the band gap wavelength is shortened. Thus, the excellent spot-size conversion passive waveguide having a small optical absorb loss can be obtained in this example.

Subsequently, a $SiO_2$ mask 10 having the opening width 1 μm for selectively growing a buried layer is formed on an n-InP substrate 1a by the use of the CVD method, the photo-lithography and the dry-etching method, as illustrated in FIG. 10C. Thereafter, a p-InP buried layer 12 and a p-InGaAs contact layer 13a are successively grown. Subsequently, an insulating film 15 is deposited, as illustrated in FIG. 10D. After an opening is formed to expose a surface a p-InGsAs contact layer 13a, electrodes 14 are formed the upper and lower surfaces of the substrate 1a. Thus, the semiconductor laser of the vertical and lateral taper type having the narrow beam divergence is completed in this example, as illustrated in FIG. 10D.

In this event, the length of the opening which is formed in the insulating film 15 is equal to 220 μm at the total of 190 μm at the rear straight portion 4 and 30 μm at the rear side of the taper portion 5. Thereby, the deterioration of the L-I characteristic which is caused by a supersaturation absorb phenomenon is avoided at the taper rear portion having the band gap wavelength relatively close to the oscillation wavelength of the laser.

In FIGS. 12A through 12C, a L-I characteristic and a beam divergence characteristic of the semiconductor optical device rear indicated. Herein, the semiconductor optical device is coated with a multi-film which has a reflection rate of 95% at a rear facet after cleaving a resonator length to 360 μm. In this event, the threshold current is equal to 8.0 mA at 25° C., the slope efficiency is equal to 0.45 W/A, the full width at half maximum of the far-field pattern image optical strength distribution is equal to 10.8° in the parallel direction and 10.6° in the vertical direction. Thus, the narrow beam divergence characteristic has an excellent aspect ratio.

Further, the width of each of the active layers of thirty devices which are taken out from arbitrary positions within radius 18 mm of three different wafer has an average value of 0.224 μm and a standard deviation of 0.021 μm at the forward facet, and the average value of 1.177 μm and the standard deviation of 0.024 μm at the rear facet, respectively. Thus, the semiconductor optical device is excessively superior in the uniformity and the reproducibility.

Each of three hundred devices which are taken out in the same manner has the standard deviation of 0.62 mA of the threshold current at 25° C., the standard deviation of the slope efficiency of 0.041 W/A, the standard deviation of the full width at half maximum of the far-field pattern optical strength distribution of 0.4° in the parallel and vertical directions. Thus, the semiconductor optical device has excessively excellent uniformity and the reproducibility.

In this event, the full width at half maximum of the far-field pattern optical strength distribution of the spot-size conversion waveguide integration laser which has only the vertical direction taper and which is manufactured on the condition that the opening width Wo is constantly set to 1.6 μm at the design of the same mask width with this example is equal to 13° in the parallel and 15° in the vertical direction. As a result, it is confirmed that the spot-size conversion waveguide integration laser having the vertical and lateral taper type is advantageous in the spot-size conversion efficiency and the aspect ratio of the optical spot.

(Third Example)

Figure 13A:
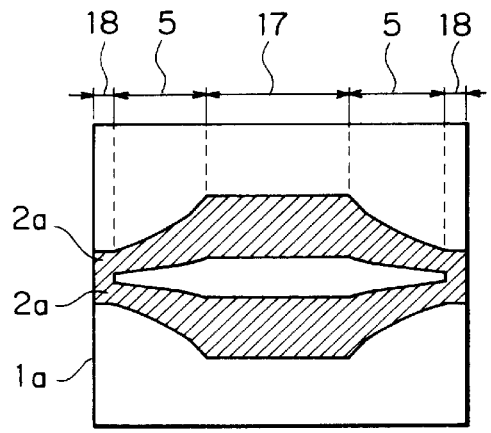
FIG. 13A is a plan view for explaining a step of manufacturing a semiconductor optical device according to a third example corresponding to the second embodiment illustrated in FIG. 4.

Referring to FIGS. 13A through 3D, description will be made about a semiconductor optical device according to a third example of this invention. Herein, the third example corresponds to the second emobdiment illustrated in FIG. 4.

As shown in FIG. 13A, a $SiO_2$ film having the layer thickness of 0.1 μm is deposited by the use of the on an n-InP substrate 1a and is patterned by the use of the photo-lithography method and the dry-etching method to form a $SiO_2$ mask 2a. The mask width Wm and the opening width Wo of the mask 2a are set to 50.0 μm and 2.0 μm in the lenear gain waveguide portion 17 having the length of 190 μm, respectively. Further, the mask width Wm and the opening width Wo gradually become smaller in the taper portions 5 having the length of 130 μm, and are set to 1.0 μm and 0.6 μm in the portions which contact with the window structure portions 18 having the length of 10 μm, respectively.

Figure 13B:
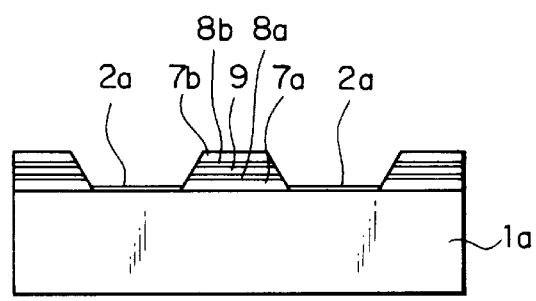
FIGS. 13B through 13D are cross sectional views for explaining steps of manufacturing a semiconductor optical device according to a third example.

On the n-InP substrate 1a having such a $SiO_2$ mask 2a, an n-InP clad layer 7a (the thickness of 0.2 μm, the doping concentration of $1\times10^{18}$ cm$^{-3}$), an n-type InGaAsP-SCH layer 8a (the PL wavelength of 1.05 μm composition, the thickness of 50 nm+the PL wavelength of 1.13 μm composition, the thickness of 10 nm), a MQW layer 9 (the number of quantum well of six, the PL wavelength of about 1.3 μm) consisting of an InGaAsP quantum well structure layer (the thickness of 5 nm) with +0.7% compressive strain and an InGaAsP barrier layer (the PL wavelength of 1.13 μm composition, the thickness of 8 nm), a p-type InGa AsP-SCH layer 8b (the PL wavelength of 1.13 μm composition, the thickness of 10 nm+the PL wavelength of 1.05 μm composition, the thickness of 50 nm)) and a p-InP clad layer 7b (the thickness of 0.1 μm, the doping concentration of $7 \times 10^{17}$ cm$^{-3}$) are successively deposited under the composition and the layer thickness design value in the rear gain waveguide portion 17 (WM=50.0 μm, Wo=2.0 μm), as illustrated in FIG. 13B.

Figure 13C:
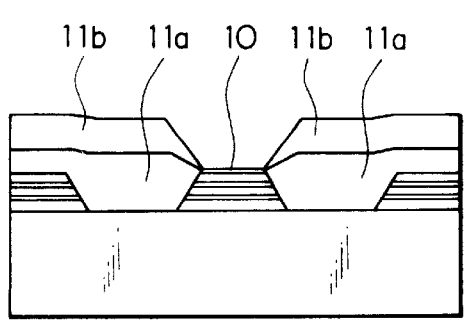

Subsequently, after SiO$_2$ mask 2a is removed, another SiO$_2$ mask 10 is formed only on the mesa type optical waveguide including the active layer by the use of the CVD method and the photo-lithography method, as illustrated in FIG. 13C. Thereafter, a current blocking structure consisting of a p-InP blocking layer 11a (the thickness of 0.5 μm, the doping concentration of $3 \times 10^{17}$ cm$^{-3}$) and an n-InP blocking layer 11b (the thickness of 0.7 μm, the doping concentration of $1 \times 10^{18}$ cm$^{-3}$) is successively deposited.

Figure 13D:
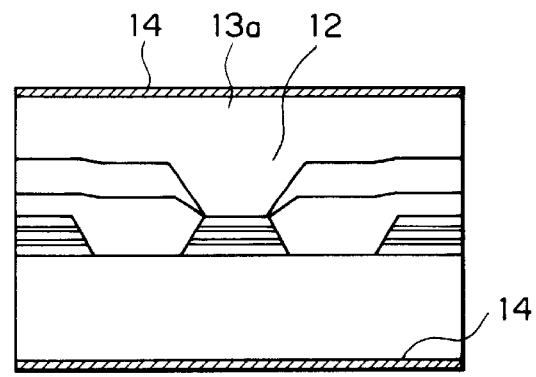

Further, after the SiO$_2$ mask 10 is removed, a p-InP embedding layer 12 and a p-InGaAs contact layer 13a are successively deposited, as illustrated in FIG. 13D. Finally, electrodes 14 are formed on upper and lower surfaces of the substrate 1a, and is cleaved to the device length of 450 μm. Thus, the semiconductor optical amplifier having the facet of the window structure is finally obtained, as illustrated in FIG. 13D.

(Fourth Example)

Referring to FIGS. 14A through 14D, description will be made about a semiconductor optical device according to a fourth example of this invention. Herein, the fourth example corresponds to the third embodiment illustrated in FIG. 5.

Figures 14A, 14B:
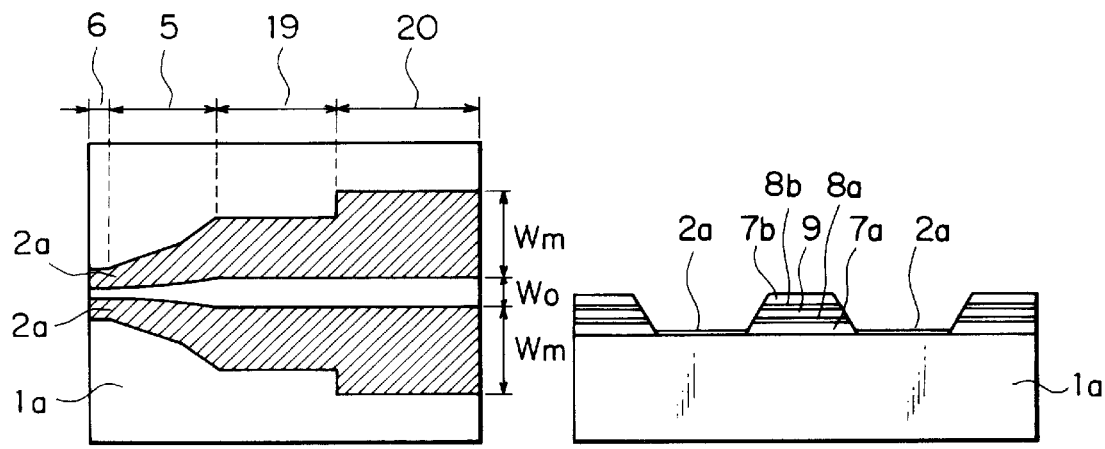
FIG. 14A is a plan view for explaining a step of manufacturing a semiconductor optical device according to a fourth example corresponding to the third embodiment illustrated in FIG. 5.
FIGS. 14B through 14D are cross sectional views for explaining steps of manufacturing a semiconductor optical device according to a fourth example.

As shown in FIG. 14A, a SiO$_2$ film having the layer thickness of 0.05 μm is deposited by the use of the CVD method on an n-InP substrate 1a and is patterned by the use of the photo-lithography method and the dry-etching method to form a SiO$_2$ mask 2a. The mask width Wm and the opening width Wo of the mask 2a are set to 50.0 μm and 2.0 μm in the DFB laser portion 20 having the length of 180 μm, respectively.

Further, the mask width WM and the opening width Wo gradually become smaller in the taper portion 5 of the length of 150 μm from Wm=35.0 μm and Wo=2.0 μm in the electrical absorb type modulator portion 19 having the length of 160 μm, and are set to 1.5 μm and 1.0 μm in the forward straight portion 6 having the length 10 μm, respectively.

On the n-InP substrate 1a having such a SiO$_2$ mask 2a, an n-InP clad layer 7a (the thickness of 0.2 μm, the doping concentration of $1 \times 10^{18}$ cm$^{-3}$), an n-type InGaAsP-SCH layer 8a (the PL wavelength of 1.13 μm composition, the thickness of 50 nm), a MQW layer 9 (the number of quantum well of seven, the PL wavelength of about 1.3 μm) consisting of an InGaAsP quantum well structure layer (the thickness of 5 nm) with +1.0% compressive strain and an InGaAsP barrier layer (the PL wavelength of 1.1 μm composition, the thickness of 8 nm), a p-type InGaAsP-SCH layer 8b (the PL wavelength of 1.13 μm composition, the thickness of 50 nm) and a p-InP clad layer 7b (the thickness of 0.1 μm, the doping concentration of $7 \times 10^{17}$ cm$^{-3}$) are successively deposited under the composition and the layer thickness design value in the DFB laser portion 20 (WM=50.0 μm, Wo=2.0 μm), as illustrated in FIG. 14B. Herein, the layer thickness and band gap wavelength of the active layer which is combined with the electrical absorb type modulator portion 19, the SCH layers 8a, 8b and the MQW layer 9 in the taper portion 5 are equal to 160 nm and 1.27 μm, respectively.

Figures 14C, 14D:
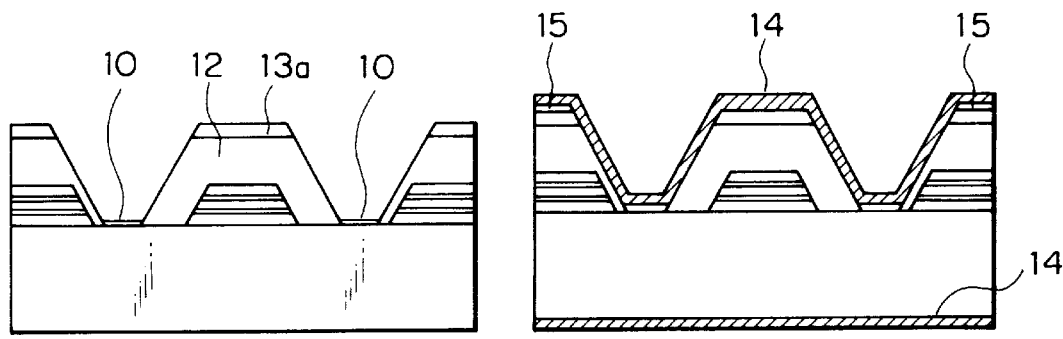

Subsequently, after a diffraction grating (not shown) is formed on the p-InP clad layer 7b of the DFB laser portion 20, another SiO$_2$ mask 10 for selectively growing a buried layer having the opening width of 1 μm is formed on the n-InP substrate 1a by the use of the CVD method, the photo-lithography method and the dry-etching method, as illustrated in FIG. 14C.

Next, a p-InP buried layer 12 and a p-InGaAs contact layer 13a are successively deposited on the substrate 1a, as illustrated in FIG. 14C.

Successively, an insulating film 15 is deposited by the use of the CVD method, as shown in FIG. 14D. After an opening is formed on the p-InGaAs contact layer 13 in the electrical absorb type modulator portion 19 and the DFB laser portion 20, electrodes 14 are formed on upper and lower surfaces of the substrate 1a. Thus, the modulator integration DFB laser is completed in this example, as illustrated in FIG. 14.

Although the preferred embodiments has been described as mentioned before, this invention is not limited to above embodiments.

For instance, although the Fabry-perot type resonator and the DFB laser are exemplified as the laser, the DBR laser may be used. Further, the oscillation wavelength is equal to 1.3 μm in the above embodiments. Alternatively, any wavelength band including, for example, a visible wavelength band, such as 1.55 μm, 1.65 μm, 0.98 μm and 0.68 μm, may be used.

Moreover, although the MQW structure having the compressive strained quantum well layer is used in the above embodiments, the MQW structure having an distortion, a distortion compensation type MQW structure and a bulk active layer may be used. Further, AlGaInAs/InP system, AlGaAs/GaAs system, AlGaInP/GaInP system may be used as the materials other than the InGaAsP/InP system in the above-mentioned embodiments.

Further, a buried structure having, for example, a semi-insulating Fe doped InP may be used instead of the pnpn type current block structure of the homo-embedding structure of the P-InP. Moreover, the conductivity type of the substrate is not limited to the n-type in the above emobdiment, and may be a p-type.

What is claimed is:

1. A semiconductor optical device comprising:

a gain region for oscillating a laser light beam;

a spot-size conversion region for converting a spot-size of the laser light beam emitted from said gain region; and an optical waveguide along said gain region and said spot-size conversion region, wherein said optical waveguide has a waveguide taper portion which is formed by the use of a selective growth mask in said spot-size conversion region and has a width and a facet so that the width gradually becomes narrower towards the facet and, as a result, the waveguide taper portion is tapered along a direction from said gain region towards the facet.

2. A device a claimed in claim 1, wherein:

said optical waveguide further has a rear straight portion at a rear portion of said device to serve as said gain region.

3. A device as claimed in claim 1, wherein:

said optical waveguide has a forward straight portion at a forward facet of said device.

4. A device as claimed in claim 1, wherein:

said optical waveguide further has an electrical absorb type modulator portion coupled to a rear end of said waveguide taper portion, and a distributed feedback laser portion coupled to a rear end of said electrical absorb type modulator portion, said distributed feedback laser portion being wider in width than said electrical absorb type modulator portion.

5. A device as claimed in claim 1, wherein:

said optical waveguide has a layer thickness and a band gap wavelength in said waveguide taper portion, said layer thickness and the band gap wavelength being kept substantially constant, said waveguide taper portion serving as an active waveguide.

6. A device as claimed in claim 1, wherein:

said optical waveguide has a layer thickness and a band gap wavelength in said waveguide taper portion, the layer thickness becomes thinner to shorten the band gap wavelength as the width of the optical waveguide becomes narrower towards the facet, said waveguide taper portion serving as a passive waveguide.

7. A device as claimed in claim 1, wherein:

said selective growth mask has a mask taper portion which has a mask width and a mask opening width;

both the mask width and the mask opening width gradually becoming narrower in said mask taper portion towards the facet.

8. A device as claim din claim 4, wherein:

said selective growth mask has a first straight portion which corresponds to said electrical absorb type modulator portion and a second straight portion which corresponds to said distributed feedback laser portion, the second straight portion having a wider width and a higher layer thickness than the first straight portion.

9. A device as claimed in claim 1, wherein:

said optical waveguide is composed of clad layers and an active layer having a quantum well structure therebetween.

10. A semiconductor optical device comprising:

a gain region for oscillating a laser light beam;

a spot-size conversion region for converting a spot-size of the laser light beam emitted from said gain region; and an optical waveguide along said gain region and said spot-sized conversion region, wherein said optical waveguide comprises
   a first waveguide taper portion which is formed by the use of selective growth mask in said spot-size conversion region at a front facet of said device and which has a first width so that the first width gradually becomes narrower towards the front facet and, as a result, the first waveguide taper portion is tapered along a direction from said gain region towards the front facet; and a second waveguide taper portion which is formed by the use of the selective growth mask in said spot-size conversion region at a rear facet of said device and which has a second width so that the second width gradually becomes narrower towards the rear facet and, as a result, the second waveguide taper portion is tapered along a direction from said gain region towards the rear facet.

11. A device as claimed in claim 10, wherein:

said optical waveguide further comprises a middle straight portion between said first and second waveguide taper portions to serve as said gain region.

12. A device as claimed in claim 10, wherein:

said optical waveguide has a front straight portion at the front facet and a rear straight portion at the rear facet.

13. A device as claimed in claim 10, wherein:

said optical waveguide has further window structure portions at the front facet and the rear facet.

14. A device as claimed in claim 10, wherein:

said optical waveguide has a first layer thickness and a first band gap wavelength in said first waveguide taper portion, and said optical waveguide has a second layer thickness and a second band gap wavelength in said second waveguide taper portion, the first layer thickness and the first band gap wavelength being kept substantially constant, the second layer thickness and the second band gap wavelength being kept substantially constant, said optical waveguide serving as an active waveguide.

15. A device as claimed in claim 10, wherein:

said first optical waveguide has a first layer thickness and a first band gap wavelength in said first waveguide taper portion, and said second optical waveguide has a second layer thickness and a second band gap wavelength in said second waveguide taper portion, the first layer thickness becoming thinner to shorten the first band gap wavelength as the width of the optical waveguide becoming narrower towards the front facet, the second layer thickness becoming thinner to shorten the first band gap wavelength as the width of the optical waveguide becoming narrower towards the rear facet, said optical waveguide serving as a passive waveguide.

16. A device as claimed in claim 10, wherein:

said selective growth mask comprises:
   a first mask taper portion which has a first mask width and a first mask opening width;
   a second mask taper portion which has a second mask width and a second mask opening width;
   both the first mask width and the first mask opening width gradually becoming narrower in said first mask taper portion towards the front facet,
   both the second mask width and the second mask opening width gradually becoming narrower in said second mask tape portion towards the rear facet.

17. A device as claimed in cliam 10, wherein:

said optical waveguide is composed of clad layers and an active layer having a quantum well structure therebetween.

* * * * *